United States Patent [19]

Mayo et al.

[11] Patent Number: 4,510,585

[45] Date of Patent: Apr. 9, 1985

[54] ELECTRONIC FILTER

[75] Inventors: Franklin W. Mayo; Miles A. Smither, both of Houston, Tex.

[73] Assignee: Geosource Inc., Houston, Tex.

[21] Appl. No.: 199,536

[22] Filed: Oct. 22, 1980

[51] Int. Cl.³ .................. G01V 1/22; H03K 17/16
[52] U.S. Cl. .................. 367/43; 307/520; 307/543; 328/167
[58] Field of Search .......... 367/43; 364/724; 307/494, 520, 542, 543, 240; 333/173, 174; 340/856; 361/10; 328/167; 179/18 F, 18 FH

[56] References Cited

U.S. PATENT DOCUMENTS

| | | | |
|---|---|---|---|
| 3,180,445 | 4/1965 | Schwartz et al. | 367/43 |
| 3,568,142 | 3/1971 | Landrum, Jr. et al. | 367/43 |
| 3,740,588 | 6/1973 | Stratton et al. | 307/240 |
| 3,777,178 | 12/1973 | Gratzmuller | 361/10 X |
| 3,803,423 | 4/1974 | Libby | 333/174 X |
| 4,009,400 | 2/1977 | Harris et al. | 328/167 X |
| 4,027,173 | 5/1977 | Nomiya et al. | 361/10 X |
| 4,031,506 | 6/1977 | Siems | 340/15.5 GC |
| 4,041,443 | 8/1977 | Thigpen | 340/15.5 AF |
| 4,152,691 | 5/1979 | Ward | 367/43 |

FOREIGN PATENT DOCUMENTS

| | | | |
|---|---|---|---|
| 959948 | 12/1974 | Canada | 333/31.3 |
| 1223560 | 2/1971 | United Kingdom . | |
| 1240133 | 7/1971 | United Kingdom . | |
| 1323917 | 4/1973 | United Kingdom . | |
| 1323918 | 7/1973 | United Kingdom . | |
| 1550798 | 8/1979 | United Kingdom . | |

OTHER PUBLICATIONS

"Electronic Letters", vol. 5, No. 1, pp. 12-13, (Jan. 1969).
Sun and Frisch, "Resistance Multiplication in Integrated Circuits by Means of Switching", *IEEE Transactions on Circuit Theory*, vol. CT-15, No. 3, pp. 184-192, (Sep. 1969).
Kaehler, "Periodic Switched Filter Networks-A Means of Amplifying and Varying Transfer Functions", *IEEE Journal of Solid-State Circuits*, pp. 225-230, (Aug. 1969).

Primary Examiner—Maynard R. Wilbur
Assistant Examiner—K. R. Kaiser
Attorney, Agent, or Firm—Arnold, White & Durkee

[57] ABSTRACT

An improved duty cycle controlled filter, wherein a resistance is included in every circuit path that exists between a switch terminal and an amplifier terminal. Such improved filter produces low distortion and has been found to be especially useful in data acquisition circuits of seismic exploration systems.

5 Claims, 6 Drawing Figures

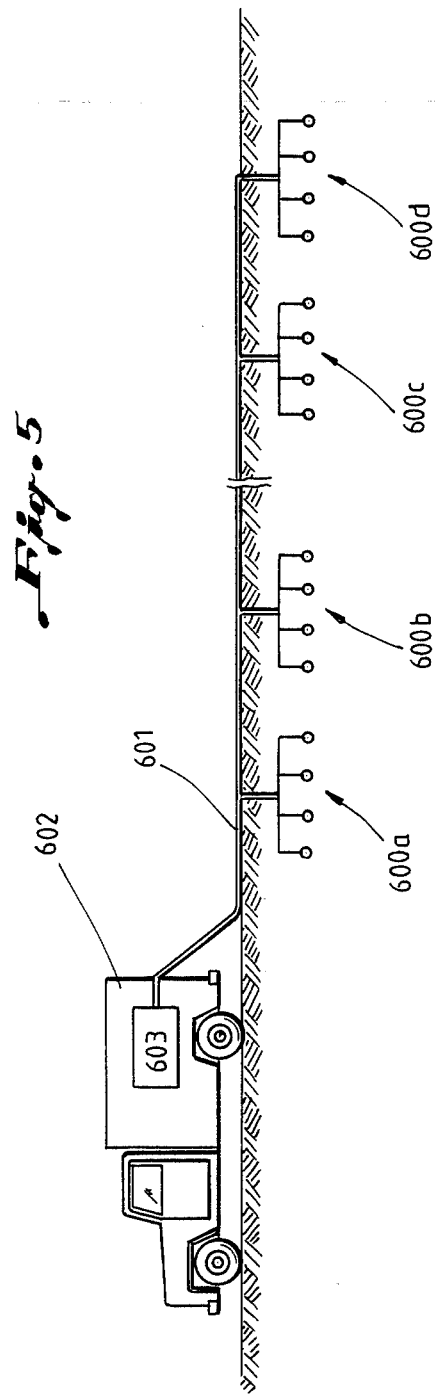

ELECTRONIC FILTER

BACKGROUND OF THE INVENTION

1. Field of the Invention

The present invention relates to electronic filters, and, more particularly, to switched active filters. Filters in accordance with the present invention have been found to be especially useful in data acquisition circuits of seismic exploration systems.

2. Description of the Prior Art

Electronic filters are devices which transmit, i.e., "pass", input signals of certain frequencies, while substantially attenuating input signals of other frequencies. For example, a low-pass filter will transmit signals below a certain frequency (the cutoff frequency), while attenuating signals above the cutoff frequency.

Two categories of filters commonly in use today are active and passive. As the name implies, an active filter is one having one or more active elements, the most common example of an active element being an amplifier. In addition to active elements, an active filter also includes resistance-capacitance (R-C) networks, and the values of the product of resistance and capacitance in those networks determine the transfer function of the filter, which is the mathematical relationship between the output and input of the filter.

In certain applications, e.g., seismic exploration, it is desirable to be able to vary the cutoff frequency of a given filter over a range of frequencies. One method whereby the cutoff frequency may be varied is by statically switching a different set of fixed components (e.g., resistors and/or capacitors) into or out of the filter circuit. Since each time constant (R-C product) in the filter must be scaled by the same amount in order to maintain the same transfer function scaled to a different frequency, one switch and one component must be provided for each pole of the filter and each change in frequency. It is often the case that the static switching network described above is implemented with a rotary switch, with the fixed components being connected to the terminals of the switch.

Yet another method whereby the cutoff frequency of a filter may be varied is by using a duty cycle controlled filter. Such duty cycle controlled filters include one or more electronic switches which are closed during the on state of a periodic switching signal and opened during the off state of the switching signal. Under appropriate conditions, the duty cycle of the periodic switching signal (i.e., ratio of "on" time to total period) determines the effective time constant or time constants of the filter.

The opening and closing of the switches in duty cycle controlled filters produce transient voltages, which can cause distortion, if they are allowed to enter an amplifier unimpeded. Thus, while such filters have been available, they have not been used in applications requiring low levels of distortion, e.g., seismic exploration. This shortcoming has been overcome with the present invention.

SUMMARY OF THE INVENTION

In accordance with the present invention, an improvement is provided in a duty cycle controlled filter, having one or more amplifiers and one or more switches whose opening and closing are controlled by a periodic switching signal.

The improvement comprises isolating, with a resistance, each switch terminal and amplifier terminal which are connected by a circuit path. The original function of the filter is maintained, while the active elements of the filter are isolated from the transient voltages and currents which are generated by practical switches.

In one embodiment, the resistance is connected in series between the switch terminal and the amplifier terminal. The resistance functions to reduce the transient voltages appearing at the amplifier terminal, which transient voltages are produced as a result of the opening and closing of the switch. Accordingly, the distortion in filters constructed in accordance with the present invention is substantially lower than the distortion in prior art duty cycle controlled filters.

In accordance with the present invention, an improved filter of order greater than one is provided for use in a data acquisition channel of a seismic system. The improved filter includes a duty cycle controlled filter having a resistance, capacitance and switch. A periodic switching signal is used to close the switch, and the effective time constant of the filter is dependent on the duty cycle of the switching signal. The duty cycle may be varied between the limits of zero and 100% of the period of the switching signal. In one embodiment, the effective time constant is changed by changing the effective resistance of the filter with a switched resistor network.

BRIEF DESCRIPTION OF THE DRAWINGS

In the accompanying drawings:

FIG. 5 is a diagram of a multi-channel seismic exploration system with a plurality of groups of seismic detectors in accordance with the present invention.

DESCRIPTION OF SPECIFIC EMBODIMENTS

It will be appreciated that the present invention can take many forms and embodiments. Some embodiments of the invention are illustrated and described to give an understanding of the invention. It is not intended that such illustrative embodiments should limit the scope of the invention.

Figure 1:
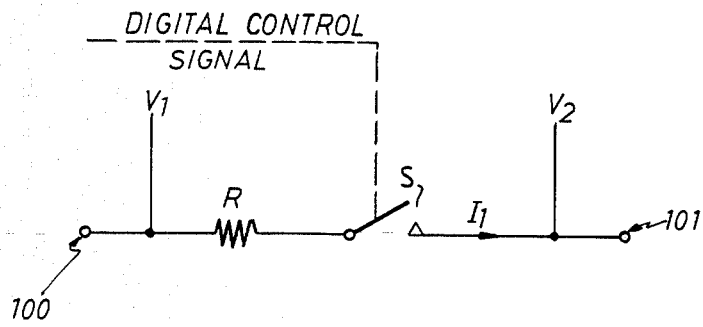
FIG. 1 is an electrical schematic diagram which illustrates a switched resistor network.
Figure 1A:
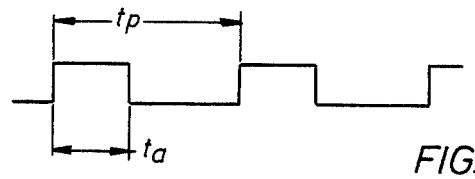
FIG. 1a is a waveform diagram which illustrates a periodic switching signal.

Referring now to FIGS. 1 and 1a, there is illustrated a switched resistor network comprising resistor R and switch S. The closing of switch S is controlled by a periodic signal labelled DIGITAL CONTROL SIGNAL, which may be generated by conventional logic circuits known in the art. During the active portion $t_a$ of the period $t_p$ of DIGITAL CONTROL SIGNAL, switch S is closed. The ratio of $t_a$ to $t_p$ is commonly referred to as the duty cycle, D, of DIGITAL CONTROL SIGNAL.

The average current $I_1$ which flows between nodes 100 and 101 is given by the expression:

$$I_1 = \frac{t_a}{t_p} \frac{(V_1 - V_2)}{R}$$

and the effective resistance, $R_{eff}$, by the expression:

$$R_{eff} = \frac{V_1 - V_2}{I_1} = \frac{t_p}{t_a} R$$

or $$R_{eff} = \frac{R}{D}$$

The effective resistance of the circuit may thus be varied by varying the duty cycle of DIGITAL CONTROL SIGNAL.

Switched resistor networks as shown in FIG. 1 have been suggested for use in filters to vary the cutoff frequency of the filter. Filters having such networks have been designated "duty cycle controlled filters" or "duty cycle modulated filters." Such filters offer the advantage of being able to utilize a given set of components (i.e., resistors and/or capacitors) for all frequencies of interest.

When the switch in the network of FIG. 1 is opened or closed, transient voltages are produced and appear at node 101. If node 101 is connected directly to an amplifer terminal, the transient voltages produce undesirable levels of distortion. In certain applications, e.g., seismic filters, it is necessary to minimize distortion. Heretofore, duty cycle controlled filters have not been used in applications requiring low distortion.

Figure 2:
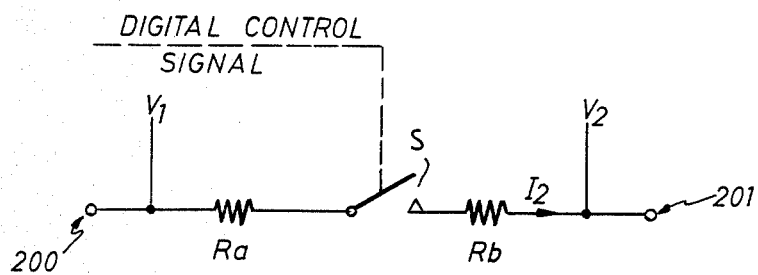
FIG. 2 is an electrical schematic diagram which illustrates switched resistor networks in accordance with the present invention.

Referring now to FIG. 2, there is illustrated one switched resistance network in accordance with the present invention. As shown, this network comprises resistances $R_a$ and $R_b$ and switch S, the terminals which are connected in series with and between $R_a$ and $R_b$. The closing of switch S is controlled by the signal labelled DIGITAL CONTROL SIGNAL, and the closure of switch S permits current to flow from node 200 to node 201. The effective resistance of the circuit of FIG. 2 is given by the expression:

$$R_{eff} = \frac{R_a + R_b}{D},$$

where d is the duty cycle of DIGITAL CONTROL SIGNAL. If the sum of $R_a$ and $R_b$ is equal to R (FIG. 1), it is seen that the effective resistance of FIG. 2 is the same as FIG. 1.

However, the network of FIG. 2 has been found to produce lower distortion than the network of FIG. 1, when either node 200 or node 201 is connected to an amplifier terminal. The lower distortion results from the fact that nodes 200 and 201 are isolated by $R_a$ and $R_b$ from the transient voltages which are produced by the opening and closing of switch S. Accordingly, either node 200 or node 201 of FIG. 2 may be connected to a terminal of an amplifier without introducing significant distortion into the amplifier.

Figure 3:
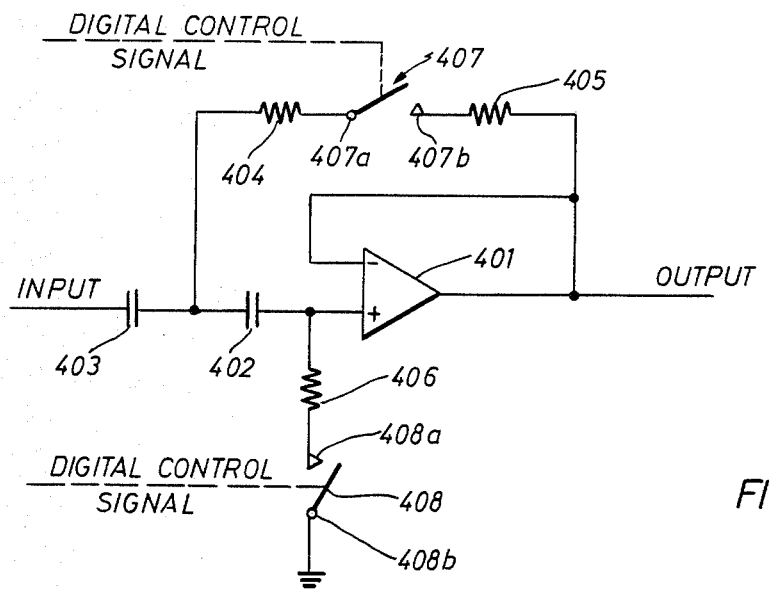
FIG. 3 is an electrical schematic diagram which illustrates a portion of a filter in accordance with the present invention.

Now referring to FIG. 3, there is illustrated a portion of a filter embodying the present invention. The illustrated portion of the filter comprises amplifier 401, capacitors 402 and 403, resistors 404–406 and switches 407 and 408, all connected as shown. The opening and closing of switches 407 and 408 are controlled by the signal labelled DIGITAL CONTROL SIGNAL, which is a signal of the type heretofore described.

Switches 407 and 408 are preferably FET type switches, such as the DG306 which is manufactured by Siliconix Incorporated.

Switch terminal 407b of switch 407 is in a first circuit path connected to both the inverting input and output terminals of amplifier 401. Therefore, in accordance with the present invention, resistance 405 is connected between terminal 407b and the inverting input and output terminals of amplifier 401 to isolate the amplifier terminals from transient voltages at terminal 407b.

Terminal 407a and the non-inverting input of amplifier 401 are in a second circuit path including capacitor 402. Voltage transients produced by the opening and closing of a switch are typically composed of high frequency signals, to which capacitor 402 presents a low impedance. Accordingly, resistor 404 is connected in the circuit path shown to isolate the non-inverting input of amplifier 401 from transients at terminal 407a.

Terminal 408a of switch 408 and the non-inverting input of amplifier 401 are also connected in a third circuit path, and, in accordance with the present invention, resistor 406 is included in said third circuit path to isolate the non-inverting input of amplifier 401 from transients at terminal 408a. Since terminal 408b of switch 408 is not in a circuit path with an amplifier terminal, no isolating resistance is required to be connected in series with switch terminal 408b.

Figure 4:
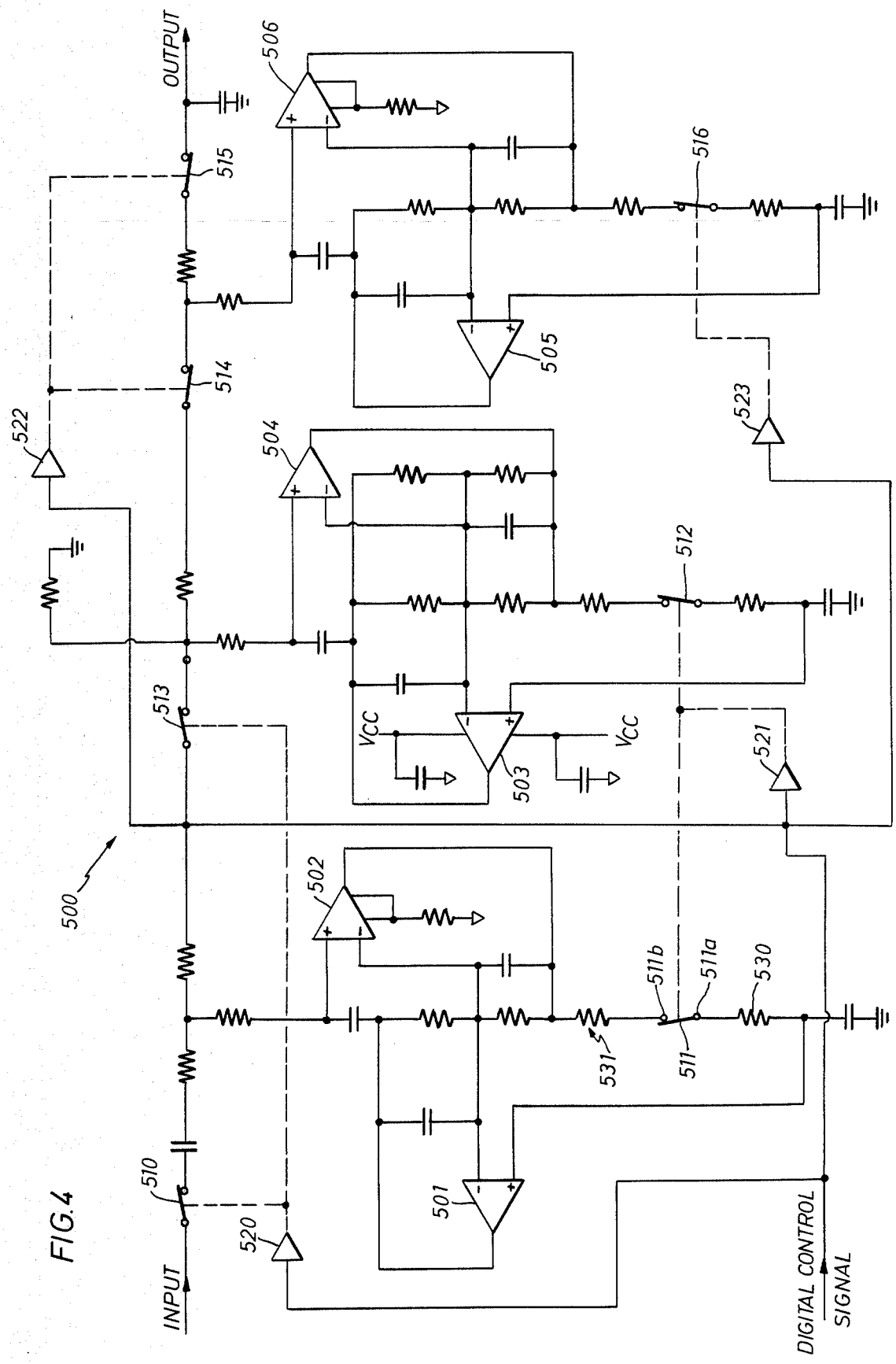
FIG. 4 is an electrical schematic diagram of a seventh order elliptic filter in accordance with the present invention.

Now referring to FIG. 4, there is illustrated the complete schematic diagram of filter 500, which may be used as an anti-alias filter in the data acquisition circuitry of a seismic exploration system. Filter 500 is preferably a frequency dependent negative resistance active realization of a seventh order elliptic filter, and the ratios of the time constants of filter 500 are chosen to achieve that realization. Each amplifier 501–506 is preferably an LM246J device.

An inspection of FIG. 4 reveals that each amplifier terminal in a circuit path with a switch terminal is isolated from the switch terminal with a resistance. For example, terminal 511a of switch 511 and the non-inverting input of amplifier 501 are connected by a circuit path. Resistor 530 is connected in that circuit path to isolate the non-inverting input of amplifier 501 from terminal 511a. Likewise, the output terminal of amplifier 502 is in a circuit path with terminal 511b of switch 511. A resistor 531 is connected as shown to isolate the output terminal of amplifier 502 from terminal 511b.

Still referring to FIG. 4, the switching signal designated DIGITAL CONTROL SIGNAL controls the opening and closing of switches 510–516 and the cutoff frequency of filter 500, in the manner heretofore described. Since filter 500 is intended for use as an anti-alias filter, the duty cycle of DIGITAL CONTROL SIGNAL determines the anti-alias cutoff frequency of the filter. Preferably, the switches are implemented with DG306CJ FET switches, which include buffer devices 520–523.

Referring to FIG. 5, a seismic exploration system is shown which comprises a plurality of groups of seismic detectors, 600 a–d, a cable 601 for carrying seismic data to and from the detectors, and a central location, such as a truck 602 where the data is analyzed. A filter (or filters) of the type described above is incorporated in a central control unit 603, one filter being associated with each input channel in the cable 601.

From the foregoing, it is seen that the effective time constant of a filter may be changed by varying the active state of the switching signal, while maintaining a constant period. In addition to that technique, the effective time constant may be changed by: (1) varying the period of the switching signal, while maintaining the duration of the active state at a constant value; or (2) varying both the period and the duration of the active state of the switching signal. The following claims are intended to cover such alternate techniques.

What is claimed is:

1. A duty cycle controlled filter of order greater than one wherein said filter comprises resistance-capacitance time constant circuits coupled to amplifier elements and wherein switches responsive to a periodic switching signal change the effective resistance of said time constant circuits and wherein at least a portion of the resistance comprising said resistance-capacitance time constant circuits is placed in series between each amplifier terminal and each switch terminal which is in series with that amplifier terminal.

2. A duty cycle controlled filter of an order greater than one for use in a data acquisition channel of a seismic exploration system, comprising:
   resistance elements;
   capacitance elements, at least a portion of which are coupled to at least a portion of said resistance elements to form resistance-capacitance time constant circuits;
   amplifier elements coupled to said time constant circuits, and;
   switches coupled to said time constant circuits, which switches open and close in response to a periodic switching signal and wherein said switches change the effective time constants of the filter by changing the effective resistance in said resistance-capacitance time constant circuits and wherein each amplifier terminal is isolated by a resistance element from each switch element in a circuit path with that terminal.

3. The duty cycle controlled filter of claim 2, wherein said resistance elements of each of said resistance-capacitance time constant circuits are distributed in series with and on either side of the switch changing the effective resistance of that time constant circuit.

4. A multi-channel seismic exploration system having a plurality of groups of seismic detectors, the output of each group being connected to an input channel of said system, each input channel having a filter of order greater than one associated therewith, each of said filters comprising:
   resistance elements;
   capacitance elements, at least a portion of which are coupled to at least a portion of said resistance elements to form resistance-capacitance time constant circuits;
   amplifier elements coupled to said time constant circuits; and
   switches coupled to said time constant circuits, which switches open and close in response to a periodic switching signal and wherein said switches change the effective time constants of the filter by changing the effective resistance in said resistance-capacitance time constant circuits and wherein each amplifier terminal is isolated by a resistance element from each switch element in a circuit path with that terminal.

5. The multi-channel seismic exploration system of claim 4, wherein said resistance elements of each of said resistance-capacitance time constant circuits are distributed in series with and on either side of the switch changing the effective resistance of that time constant circuit.

* * * * *